Aug. 5, 1958 H. P. NOWAK 2,846,626

JUNCTION TRANSISTORS AND METHODS OF FORMING THEM

Filed July 28, 1954 2 Sheets-Sheet 1

INVENTOR
HERMAN P. NOWAK
BY Elmer J. Gorn
ATTORNEY

Aug. 5, 1958 H. P. NOWAK 2,846,626

JUNCTION TRANSISTORS AND METHODS OF FORMING THEM

Filed July 28, 1954 2 Sheets-Sheet 2

INVENTOR
HERMAN P. NOWAK
BY Elmer J. Gorn
ATTORNEY

United States Patent Office 2,846,626

Patented Aug. 5, 1958

2,846,626

JUNCTION TRANSISTORS AND METHODS OF FORMING THEM

Herman P. Nowak, Salem, Mass., assignor to Raytheon Manufacturing Company, Waltham, Mass., a corporation of Delaware Application July 28, 1954, Serial No. 446,297

3 Claims. (Cl. 317—235)

This invention concerns junction transistors, and more particularly those having good operating characteristics when operated at relatively high frequencies, and methods for making such transistors.

It has been found that junction transistors operate better at high frequencies if the effective base region is as thin as possible, preferably in the order of 0.001" thick. It is also desirable that the opposing faces of this region be as nearly parallel as possible. A limited area of reduced thickness may be produced by etching confined to this limited area on one or both sides of the chip of semiconductor material. However, the bottom of the resulting hole or holes is more likely to be round than flat and parallel as desired.

By the method of the invention, a region of reduced thickness is ground into one or two opposing faces of a chip of germanium or other semiconductor material. This region of reduced thickness may be formed as a step at one edge of the chip as a notch across one or two opposing faces of the chip or as a depression in one or two opposing faces of the chip. If this region is formed by two notches, it has been found that the chip is weakened less mechanically if these notches are mutually perpendicular. Whatever method is used to form the region of reduced thickness, it is finished off by etching with one of the well-known solutions commonly used for this purpose. However, this etching is performed at a slow rate and for a short period of time. The etching period is sufficiently short that the bottom of the notch remains substantially flat. A transistor is formed from a chip prepared in this manner by depositing an appropriate doping agent on either side of the thin region. The base contact can then be made to the relatively large area of the remainder of the chip. This base contact can also be positioned closer to the thin region without causing undesired surface leakage across the face of the crystal. This method of constructing semiconductor chips for use in transistors lends itself to mass production as many such notches may be ground into a relatively large slice of a crystal of the selected semiconductor by a set of ganged saws or grindstones appropriately shaped. Similarly, the slotted slice of crystal can be cut up into separate chips by another set of ganged saws.

Other and further advantages and features of the invention will become apparent from the following description, reference being had to the drawings wherein.

Figure 1:
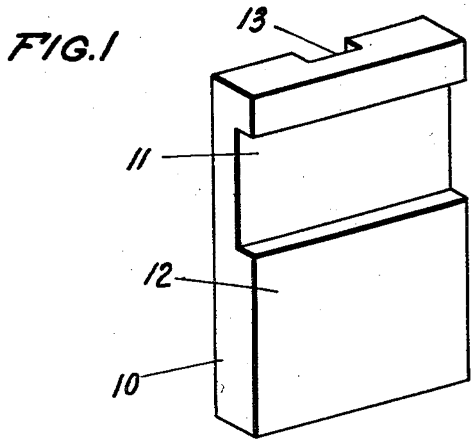
Fig. 1 is an enlarged isometric view of a preferred form of the prepared semiconductor of the invention.

In Fig. 1 the reference numeral 10 designates the body of semiconductor. A notch or slot 11 is formed across one major surface 12 of the semiconductor body 10. A second notch 13 is formed with its axis at right angles to the first notch 11 on the opposite major surface of the semiconductor body 10. In the region where these two notches cross, there will be a region having a thickness equal to the difference between the total thickness of the chip and the sum of the depths of the two notches 11 and 13. The region forms the effective base region of the completed transistor shown in Fig. 8. It will be noted that the area of reduced thickness is obtained in a way that, while simple to accomplish by grinding or cutting, also results in a minimum of weakening of the semiconductor chip.

Figures 2, 3, 9, 10, 11:
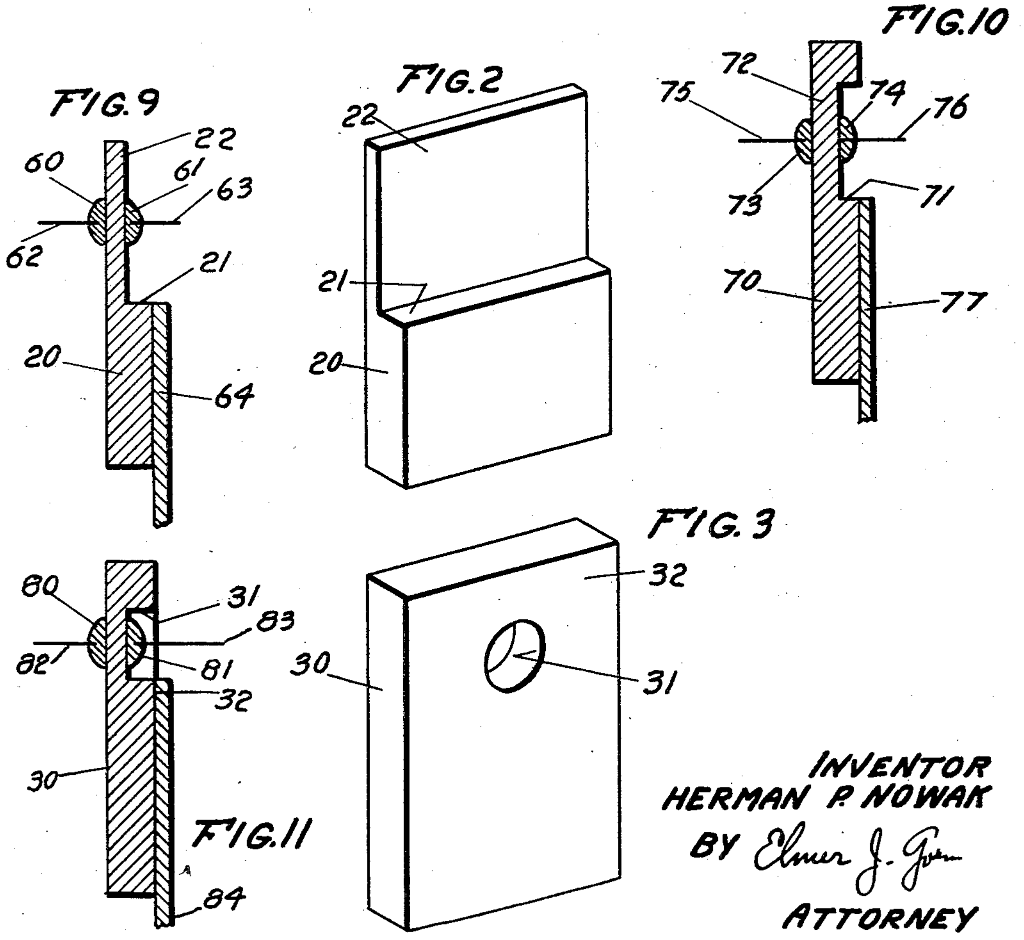
Fig. 2 is an enlarged isometric view of another form of the prepared semiconductor of the invention.
Fig. 3 is an enlarged isometric view of another form of the prepared semiconductor of the invention.
Fig. 9 is an enlarged longitudinal section of a transistor prepared from the form of chip shown in Fig. 2.
Fig. 10 is an enlarged longitudinal section of a transistor prepared from a modification of the form of chip shown in Fig. 1.
Fig. 11 is an enlarged longitudinal section of a transistor prepared from the form of chip shown in Fig. 3.

Fig. 2 shows another embodiment of the invention in which a semiconductor body 20 has a notch or step 21 cut into one edge, leaving an area 22 of reduced thickness to form the effective base region of the completed transistor, as shown in Fig. 9. This embodiment is somewhat harder to form and results in a somewhat weaker chip than the construction shown in Fig. 1.

Fig. 3 shows still another embodiment of the invention in which a semiconductor body 30 has a depression 31 formed in one major face 32. The reduced thickness between the bottom of the depression 31 and the opposite face is used for the effective base region of the completed transistor shown in Fig. 10. A second depression can also be formed on the opposite face. This embodiment is somewhat more difficult to form than the embodiment shown in either Fig. 1 or 2. Furthermore, due to the fact that the depression must be formed by some form of drilling, the bottom of the depression is likely to be round whereas, for electrical reasons, it is desirable that the bottom of the depression be virtually flat and parallel to the opposing surface.

Figure 4:
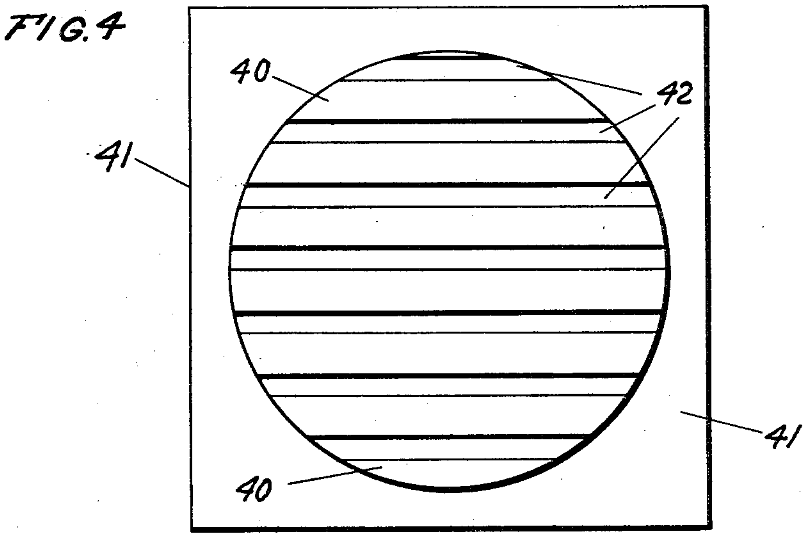
Fig. 4 is an enlarged plan view of the first step in preparing semiconductor chips in the form shown in Fig. 1 from a larger piece of semiconductor crystal.
Figure 5:
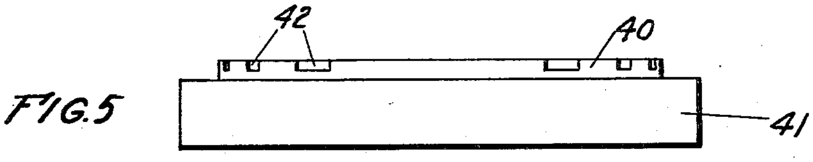
Fig. 5 is an enlarged side view of the apparatus shown in Fig. 4.
Figure 6:
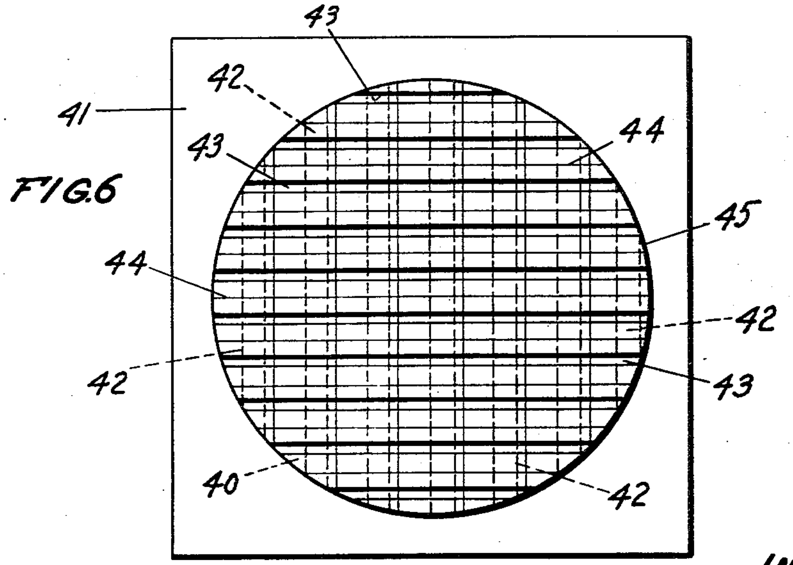
Fig. 6 is an enlarged plan view of the second and third steps in preparing semiconductor chips in the form shown in Fig. 2 from a larger piece of semiconductor.
Figure 7:
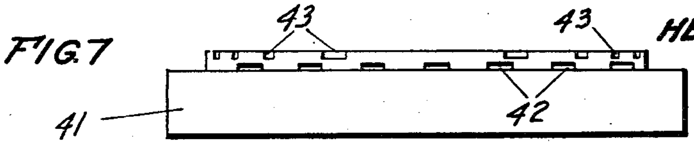
Fig. 7 is a side view of the apparatus shown in Fig. 6.

Chips of the form shown in Fig. 1 can be made by the steps as shown in Figs. 4 through 7. In Figs. 4 and 5, a slice 40 of a crystal of a semiconductor element from the fourth group of elements in the periodic table, usually either germanium or silicon, is shown attached to a supporting table 41 by wax or other appropriate means. A group of parallel grooves 42 is cut into the upper face of the slice 40 to form the notches 11 of a series of chips 10 of the type shown in Fig. 1. The slice 40 is then removed from the supporting table 41, cleaned and turned over on its other side, rotated ninety degrees about the axis of the table and refastened to the table 41. A second series of parallel grooves 43 are cut into the slice 40 to form the notches 13 of a series of chips 10. The slice 40 is then cut into chips by a series of vertical cuts 44 and horizontal cuts 45 and individual chips are then removed from the table 41 and cleaned and etched. By appropriate modifications of the pattern of cuts, chips of the type shown in Fig. 2 can be produced by gang grinding or sawing. Holes, such as the hole 31 of Fig. 3, can be drilled into one or both sides of a slice of semiconductor crystal, preferably by sonic drilling, and then the slice can be cut up into separate chips by a pattern of cuts, such as the cuts 44 and 45 of Fig. 6.

Figure 8:
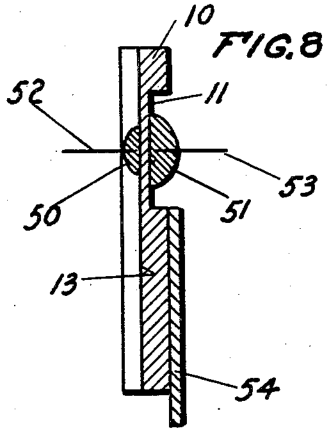
Fig. 8 is an enlarged longitudinal section of a transistor prepared from the type of chip shown in Fig. 1.

Chips of the type shown in Fig. 1 can be made into transistors of the type shown in Fig. 8 by diffusing any suitable doping material selected from either the third or fifth group of elements in the periodic table into either side of the region of reduced thickness to form diffused junctions with deposits 50 and 51. This diffusion is preferably kept within a few molecular layers so that the thickness of the base region is essentially determined by the thickness of the region of reduced thickness. The material used for the deposits will be selected so as to impart the opposite type of conductivity to the adjacent region of the semiconductor body to the type of conductivity that body already has. By types of conductivity is meant conductivity by electrons or n type conductivity as opposed to conductivity by holes or p type conductivity. While the deposits 50 and 51 are still soft, conductors 52 and 53 are inserted to provide means for connecting the deposits to the external circuit. Finally a tab 54 of conductive material is welded to the region of the chip that has its original thickness preferably on the same side of the chip as the slot 11 and extending close to the edge of this slot. The deposit 50 is isolated from the tab 54 by the wall of the slot so that the tab may be positioned close to the deposit without danger of surface leakage which prevents such close juxtaposition in the usual type of fused junction transistor. This close juxtaposition results in a lower ohmic resistance in the connection of the base contact to the effective base region. This gives the resulting transistor better performance characteristics.

Similarly, chips of the type shown in Fig. 2 can be made into transistors of the type shown in Fig. 9 by applying appropriate doping material selected in the same manner to either side of the region of reduced thickness to form deposits 60 and 61. Conductors 62 and 63 are also inserted into the deposits 60 and 61 and a tab 64 is welded to the region of original thickness. The resulting transistor has much the same advantages as the transistor of the type shown in Fig. 8.

Fig. 10 shows how a transistor can be formed from a chip that is very much like the chip of Figs. 1 and 8 except that it is formed with only one slot 71 to produce a region 72 of reduced thickness. As before, deposits 73 and 74 of appropriate doping material are attached to either side of the region 72 and conductors 75 and 76 inserted into the deposits and the tab 77 welded to the region of original thickness. Such a chip and the resulting transistor do not have the strength for the same thickness in the region 72 as does a chip of the type shown in Fig. 1.

Fig. 11 shows how a chip 30 of the type shown in Fig. 3 can be made into a transistor by applying appropriate doping material to either side of the region of reduced thickness to form deposits 80 and 81 with conductors 82 and 83 inserted therein and a tab 84 welded to the region of original thickness. The transistors of the types shown in Figs. 10 and 11 have much the same operational advantages as a transistor of the type shown in Fig. 9. However, they do not lend themselves as conveniently to mass production.

This invention is not limited to the particular details of construction, materials and processes described, as many equivalents will suggest themselves to those skilled in the art. It is accordingly desired that the appended claims be given a broad interpretation commensurate with the scope of the invention within the art.

What is claimed is:

1. A transistor comprising a piece of semiconductor material having one type of conductivity formed with a pair of mutually perpendicular areas of reduced thickness one on each of two opposite faces, a deposit of material imparting the opposite type of conductivity within each area of reduced thickness, and an ohmic contact to the main body of the semiconductor.

2. A transistor comprising a piece of germanium having one type of conductivity formed with a pair of mutually perpendicular areas of reduced thickness one on each of two opposite faces, a deposit of material imparting the opposite type of conductivity within each area of reduced thickness, and an ohmic contact to the main body of the germanium.

3. A method for making a plurality of transistors from a piece of semiconductor material having one type of conductivity comprising the steps of forming a first set of parallel slots in one side of the piece, forming a second set of parallel slots perpendicular to the first set on the opposite side of the piece, cutting through the piece between both sets of slots to form smaller pieces with intersecting slots on opposite sides, depositing material imparting the opposite type of conductivity within the slot on either side, and affixing conductive material to a thicker portion of each piece.

References Cited in the file of this patent

UNITED STATES PATENTS

| | | |
|---|---|---|
| 2,655,624 | Welker | Oct. 13, 1953 |
| 2,666,814 | Shockley | Jan. 19, 1954 |
| 2,680,159 | Grover | June 1, 1954 |
| 2,748,041 | Leverenz | May 29, 1956 |
| 2,754,431 | Johnson | July 10, 1956 |
| 2,764,642 | Shockley | Sept. 25, 1956 |
| 2,779,877 | Lehovac | Jan. 29, 1957 |

FOREIGN PATENTS

| | | |
|---|---|---|
| 1,038,658 | France | May 13, 1953 |